(12) United States Patent
Nasu et al.

(10) Patent No.: US 7,009,279 B2
(45) Date of Patent: Mar. 7, 2006

(54) SEMICONDUCTOR DEVICE CONFIGURED FOR SUPPRESSED GERMANIUM DIFFUSION FROM A GERMANIUM-DOPED REGIONS AND A METHOD FOR FABRICATION THEREOF

(75) Inventors: Shingo Nasu, Chiyoda (JP); Tomio Iwasaki, Tsukuba (JP); Hiroyuki Ohta, Tsuchiura (JP); Yukihiro Kumagai, Chiyoda (JP); Shuji Ikeda, Koganei (JP)

(73) Assignees: Hitachi, Ltd., Tokyo (JP); Trecenti Technologies, Inc., Hitachinaka (JP)

( * ) Notice: Subject to any disclaimer, the term of this patent is extended or adjusted under 35 U.S.C. 154(b) by 0 days.

(21) Appl. No.: 10/845,290

(22) Filed: May 12, 2004

(65) Prior Publication Data

US 2004/0227160 A1    Nov. 18, 2004

(30) Foreign Application Priority Data

May 12, 2003 (JP) .............................. 2003-132458

(51) Int. Cl.
*H01L 31/117* (2006.01)
(52) U.S. Cl. ....................... 257/616; 257/351; 257/371; 257/385; 257/407; 257/757; 257/768; 257/769
(58) Field of Classification Search ................ 257/351, 257/371, 385, 407, 757, 768, 769
See application file for complete search history.

(56) References Cited

U.S. PATENT DOCUMENTS 5,608,266 A * 3/1997 Agnello et al. ............. 257/768

6,214,679 B1    4/2001 Murthy et al.
6,252,283 B1 *  6/2001 Gardner et al. ............. 257/407

FOREIGN PATENT DOCUMENTS

| JP | 2000-077425 | 3/2000 |
|----|-------------|--------|
| JP | 2000-269501 | 9/2000 |
| JP | 2002-134741 | 5/2002 |
| JP | 2002-184993 | 6/2002 |

OTHER PUBLICATIONS

*Journal of Applied Physics* (Sep. 1983), 54(9):4877.
Thomas Kwok, et al., "Molecular-Dynamics Studies of Grain-Boundary . . . ," *Physical Review B* (1984), 29:5367-69.

* cited by examiner

*Primary Examiner*—Mai-Huong Tran
(74) *Attorney, Agent, or Firm*—Townsend and Townsend and Crew LLP

(57) ABSTRACT

In semiconductor devices, a semiconductor device is provided which is high in reliability while suppressing changes in characteristics such as threshold voltages. In a semiconductor device which has a gate dielectric film above a semiconductor substrate and also has above the gate dielectric film a gate electrode film made of silicon germanium chosen as its main constituent material, or alternatively in a semiconductor device which has beneath the gate dielectric film a channel made of silicon as its main constituent material and which has below the channel a channel underlayer film made of silicon germanium as its main constituent material, a specifically chosen dopant, such as cobalt (Co) or carbon (C) or nitrogen (N), is added to the gate electrode and the channel underlayer film, for use as the unit for suppressing diffusion of germanium in the gate electrode or in the channel underlayer film.

7 Claims, 6 Drawing Sheets

SEMICONDUCTOR DEVICE CONFIGURED FOR SUPPRESSED GERMANIUM DIFFUSION FROM A GERMANIUM-DOPED REGIONS AND A METHOD FOR FABRICATION THEREOF

BACKGROUND OF THE INVENTION

1. Field of the Invention

The present invention relates to semiconductor devices.

2. Description of the Prior Art

In recent years, with advances in information communication equipment, semiconductor devices such as large-scale integrated (LSI) circuit chips are becoming more strict year by year in processing performance required therefore. Under the circumstances, attempts are made to speed up the operating rates of transistors. Until today, such speed-up of transistor operation has been advanced mainly based on miniaturization or shrinkage of the fabrication sizes of gate electrodes. Recently, the gate length is shrunk to 0.1 micrometer ($\mu$m) or less. Another requirement is that the film thickness of a gate electrode is much reduced to about 20 nanometers (nm) in cases where silicon is used as the main constituent material thereof. The influence given to signal transmission delay by an increase in resistance resulted from a decrease in line width of gate electrode—this has not specifically been considered as a serious problem in past days—is becoming more significant to an extent that such is no longer negligible for achievement of ultrahigh-speed transistor operations. In order to resolve this problem, it is inevitable to employ a certain material which promises high-speed performance and low power consumption capabilities while at the same time being large in familiarity with currently established silicon process architectures. One of recently challenged approaches to discovery of such material satisfying the above-noted requirements is to make use of silicon germanium for gate electrodes. This material is germanium-added silicon, wherein the germanium is such that its electron mobility is as high as approximately 2.6 times greater than that of silicon, while the hole mobility is about 4.2 times greater than that of silicon. Another approach presently considered successful is to use a method for increasing the magnitude of a drain current by using the silicon germanium—this is greater in lattice constant than silicon—for a foundation film underlying a channel region (i.e. the so-called "channel underlayer" film) to thereby give a strain to the silicon. This is relied upon the fact that giving such strain to the silicon underlying a gate dielectric film results in an increase in electron mobility.

Unfortunately, since metal oxide semiconductor (MOS) transistor microfabrication processes typically require addition of thermal processing steps at high temperatures after having fabricated gate electrodes and/or channel underlayer films, the gate electrodes and channel underlayer films made of the silicon germanium can often experience unwanted diffusion and aggregation or cohesion of germanium occurring due to the thermal processing. This would result in a change in composition of the silicon germanium, which leads to a decrease in mobility and a change in work function of silicon germanium. This in turn pauses a problem such as a variation or fluctuation in threshold voltage values of MOS transistors. Another penalty is that any sufficient strain is no longer given to channels, resulting in occurrence of a problem as to a decrease in drain current.

A remedy for this problem is found, for example, in JP-A-2000-269501, which discloses therein one form that fabricates a carbon-contained silicon film at the upper surface of a channel underlayer film made of silicon germanium chosen as its main constituent material. Several forms which dope or implant carbon atoms into silicon-germanium gate electrodes are disclosed in Japanese patent disclosure documents, such as JP-A-2000-77425, JP-A-2002-134741, JP-A-2002-184993 and others.

However, the inventors of the invention as disclosed and claimed herein have found out that the use of the techniques for merely doping carbon in the way taught by the forms disclosed in the above-identified prior art documents suffers from a risk: an increase in leakage current in accordance with the doping amount thereof.

It is therefore an object of the present invention to provide a semiconductor device which is high in performance and low in resistance and which has an ability to suppress leakage currents.

SUMMARY OF THE INVENTION

In order to obtain the means for suppressing diffusion of germanium out of the germanium-doped gate electrode and channel underlayer film without having to increase leakage currents, the inventors of this application as filed have devoted to research and study activities, the result of which revealed that it is effective to dope either cobalt or nitrogen into the gate electrode and the channel underlayer film.

It was also found that if carbon is doped then controlling its doping amount may also contribute to resolving the problems stated above. With this approach, it is possible to provide a semiconductor device capable of suppressing germanium diffusion while at the same time lessening leakage currents to the extent that practically serious problems hardly occur.

The above-noted goal is attained by providing a semiconductor device which is specifically arranged in a way as will be set forth below.

In addition, it was demonstrated that the doping of carbon or nitrogen works effectively.

(1) In accordance with one aspect of this invention, a semiconductor device is provided which includes a semiconductor substrate, a gate dielectric film formed on or above the semiconductor substrate, and a gate electrode formed overlying the gate dielectric film, wherein the gate electrode contains therein germanium and also contains cobalt that is less in amount than the germanium. It is noted here that the expression "less in amount" should be interpreted to be a less amount in the unit of atomic percent (referred to as "atm %" or "at %" hereinafter). Additionally, it is preferable that the gate electrode be made of silicon germanium that is chosen as its main constituent material. Also note that the term "main constituent material" as used herein may refer to certain material which follows: the content of the silicon germanium contained in a layer making up the gate electrode—measured in "at %"—exceeds at least the half of an entirety thereof. The same goes with other devices to be later described.

Alternatively, a semiconductor device is provided, which is characterized in that its gate electrode contains germanium and also nitrogen, which is less in amount than the germanium.

Still alternatively, a semiconductor device is provided which is featured in that its gate electrode involves germanium and carbon, wherein the carbon is less in amount than the germanium to have a concentration of greater than or equal to 0.08 at % and yet less-than or equal to 0.96 at %.

(2) In accordance with another aspect of the invention, a semiconductor device is provided which includes a semiconductor substrate, a gate dielectric film formed on or above the semiconductor substrate, and a gate electrode formed above the gate dielectric film, wherein a channel underlayer film is formed on the substrate side of the gate dielectric film through an interval from the gate dielectric film, and wherein the channel underlayer film is made of silicon germanium chosen as its main constituent material and contains nitrogen therein. For example, this device has beneath the gate dielectric film a channel region that is made of silicon as its main constituent material, and also has a channel underlayer film which underlies the channel and which is mainly made of silicon germanium, wherein the channel underlayer film contains cobalt.

Alternatively, a semiconductor device is provided which is characterized in that a channel underlayer film is formed on the substrate side of a gate dielectric film via an interval from the gate dielectric film, wherein the channel underlayer film is made of silicon germanium as its main constituent material, which contains nitrogen.

Still alternatively, a semiconductor device is provided which is featured in that a channel underlayer film is formed on the substrate side of a gate dielectric film while being spaced apart from the gate dielectric film and in that this channel underlayer film is mainly made of silicon germanium which contains carbon doped thereinto to a concentration of more than or equal to 0.08 at % and yet less than or equal to 0.96 at %.

With any one of the forms stated above, it is possible to provide a high-performance and low-resistance semiconductor device capable of suppressing leakage currents. This in turn makes it possible to constitute a semiconductor device with high reliability for offering enhanced suppressibility of changes in characteristics such as threshold voltage values of transistors used.

Additionally, in an exemplary semiconductor device having at least one of the gate electrode and the channel underlayer film made of silicon germanium as their main component material, it is possible to offer at least one of the effects which follow. For example, it is possible to provide a semiconductor device with highly stabilized operability while letting the germanium be hardly diffused out of either the gate electrode or the channel underlayer film. Alternatively, a semiconductor device may be provided, which has a gate electrode unit that is low in electrical resistivity to thereby have the supportability of high-speed performances. Alternatively, it is to provide a semiconductor device which is high in reliability while at the same time suppressing any change in deformation given to the channel. It is also possible to provide a semiconductor device that is manufacturable with high yields at low costs.

Other objects, features and advantages of the invention will become apparent from the following description of the embodiments of the invention taken in conjunction with the accompanying drawings.

DETAILED DESCRIPTION OF THE EMBODIMENTS

Several exemplary embodiments of the present invention will be set forth below. It should be noted that this invention is not limited only to the embodiments as disclosed herein. Also note that the invention does not exclude any possible modifications and alternations based on the presently established prior art and also those deemed to be the prior art in near future. Additionally in the description below, the germanium is represented by the symbol "Ge," cobalt is abbreviated as "Co," carbon is as "C," nitrogen as "N," tungsten as "W," and molybdenum as "Mo" whenever the need arises for brevity purposes only.

Semiconductor devices embodying the invention will be described in detail below.

First Embodiment

Figure 1:
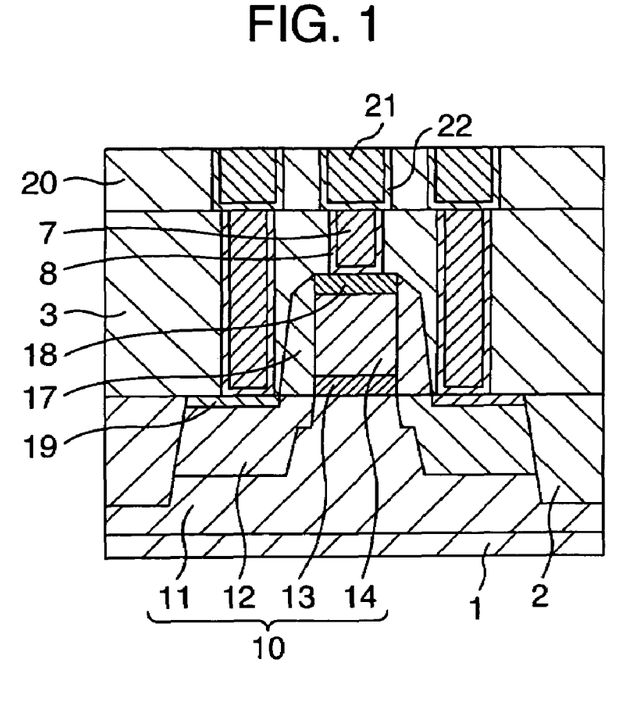
FIG. 1 is a diagram showing a cross-sectional view of main part of a semiconductor device in accordance with a first embodiment of the present invention.

A cross-sectional structure of main part of a semiconductor device in accordance with a first embodiment of the invention is shown in FIG. 1. As shown in FIG. 1, the semiconductor device of this embodiment is structured from a field effect transistor 10, which is formed on a silicon substrate 1.

The field effect transistor 10 includes a pair of spaced-apart source/drain regions 12 formed in a well 11, a gate dielectric film 13, and a gate electrode 14. The gate electrode 14 has its upper surface on which a silicide film 18 is formed, whereas the source/drain 12 has its surface on which a silicide 19 is formed. Note that the source/drain 12 refers to either a source region or a drain region, wherein these source/drain regions laterally oppose each other with the overlying gate electrode 14 residing therebetween. A difference between the source and the drain is principally originated from the difference in direction of current flow. As these regions are similar to each other in structure per se, each of them will be recited as the "source/drain 12" in the rest of this description. Additionally, the illustrative transistor is electrically separated or isolated from the other transistors by a shallow trench-isolator 2, which is typically made of silicon oxide or silicon nitride.

The gate dielectric film 13 is constituted, for example, from a dielectric film made of silicon oxide, silicon nitride, titanium oxide, zirconium oxide, hafnium oxide, tantalum dioxide, silicon pentoxide or other similar suitable materials or a stacked or "multilayered" structure of any two or more ones selected from the above-noted materials. The film 13 is fabricated, for example, by chemical vapor deposition (CVD) methods, sputter methods or the like. Regarding the gate electrode 14, this is made of silicon germanium for use as its main constituent material and is fabricated, for example, by CVD methods, sputter methods, molecular beam epitaxy methods or else.

On side walls of the gate dielectric film 13 and gate electrode 14 plus silicide films 18–19, sidewalls 17 are formed, which are made of silicon oxide or silicon nitride.

The field effect transistor 10's upper surface is covered with a boron-doped phosphorus silicate glass (BPSG) film, a spin-on-glass (SOG) film, a tetra-ethyl-ortho-silicate (TEOS) film, or an interlayer dielectric film 3 made of silicon oxide, which is fabricated by chemical vapor deposition (CVD) methods or sputter methods.

The field effect transistor 10 formed on the silicon substrate 1 is electrically connected by a contact plug 7 and a wiring lead 21 shown in FIG. 1 and others in such a way that a desired circuit is configured.

This embodiment offers an effect of suppressing or inhibiting diffusion of Ge atoms, which will be explained below using the evaluation results of molecular dynamics simulation tests. The molecular dynamics simulation is a method for calculating the force working on each atom through an interatomic potential(s) and for solving, based on this force, Newton's law of motion to thereby calculate the position of each atom at a respective time point, as described in "Journal of Applied Physics," Vol. 54, (1983) at p. 4877.

The effect of this embodiment is that letting the gate electrode contain doped atoms or "dopants" serves to suppress or prevent the diffusion of Ge atoms in the gate electrode otherwise occurring due to thermal processing after fabrication of the gate electrode. Then, the embodiment's effect may be evaluated by calculating the coefficient of self-diffusion of Ge and then comparing resultant values with each other, one of which is obtained when the gate electrode contains dopants and the other of which is when such dopants are absent. A method of calculating the self-diffusion coefficient by molecular dynamics simulation is disclosed, for example, in "Physical Review B," Vol. 29 (1984) at pp. 5367–5369.

Figure 2:
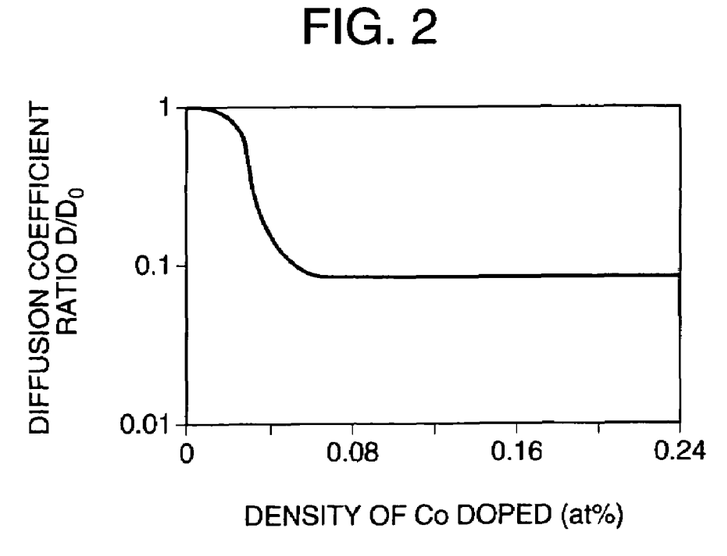
FIG. 2 is a diagram showing the dopant concentration dependency of D/Do in a low concentration region in the case of doping Co into silicon germanium.
Figure 3:
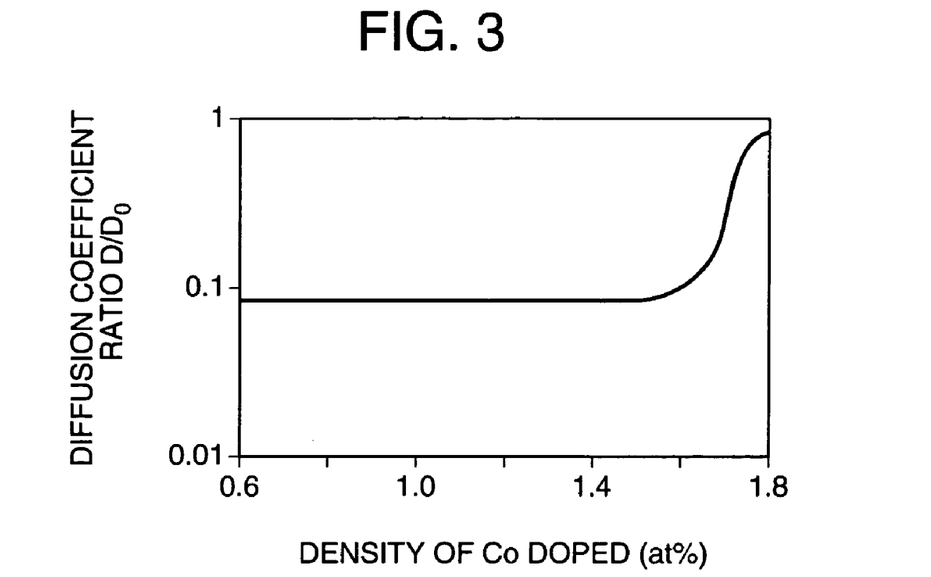
FIG. 3 is a diagram showing the dopant concentration dependency of D/Do in a high concentration region in the case of Co doped into the silicon germanium.

Firstly, there is shown a calculation example which uses a cubic body as an analysis model of the gate electrode, wherein the cube is made of silicon germanium (silicon:germanium=1:1) with an equal side of 3 nm. Calculation results of the ratio of Ge diffusion coefficient D when Ge in the gate electrode diffuses at 900° C. are shown in FIGS. 2 to 7. In these graphs, Do is the diffusion coefficient in case the gate contains no dopants. FIG. 2 shows a simulation result of the dopant concentration dependency of the ratio D/Do in a low density region in the case of doping Co into the silicon germanium. FIG. 3 shows a result indicating the D/Do dopant concentration dependency in a high density region. More specifically, FIG. 2 is a graph showing the diffusion coefficient of germanium at 900° C. in the event of diffusion of the germanium in the gate electrode formed of a silicon-germanium cubic body with its each side of 3 nm, with respect to a region which is low in doping concentration of cobalt. FIG. 3 is a graph showing the diffusion coefficient of germanium at 900° C. upon diffusion of the germanium in the gate electrode of the silicon-germanium cubic body with each side of 3 nm, in relation to a region that is high in doping concentration of cobalt.

Figure 4:
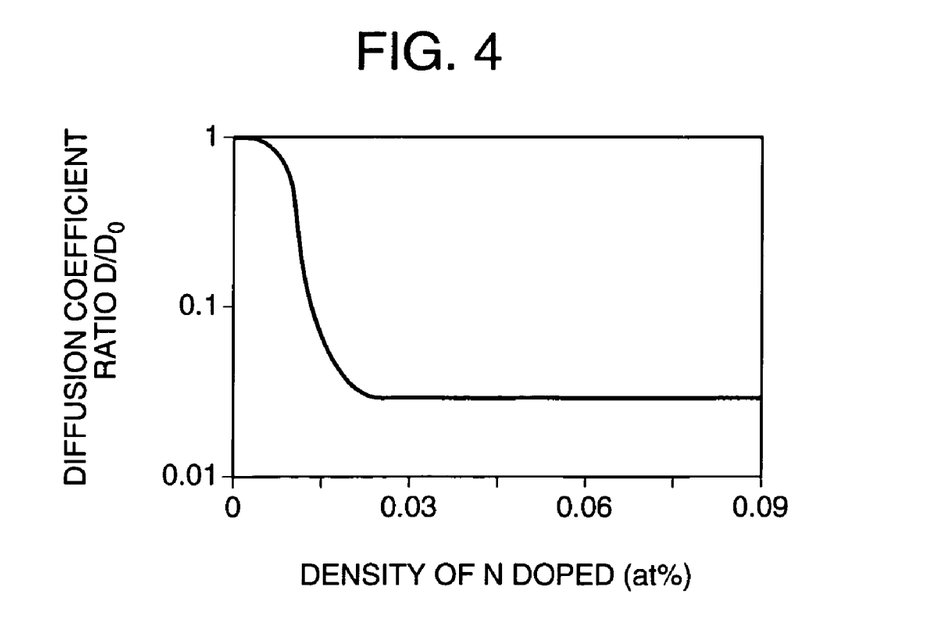
FIG. 4 is a diagram showing the dopant concentration dependency of D/Do in a low concentration region in the case of N doped into the silicon germanium.
Figure 5:
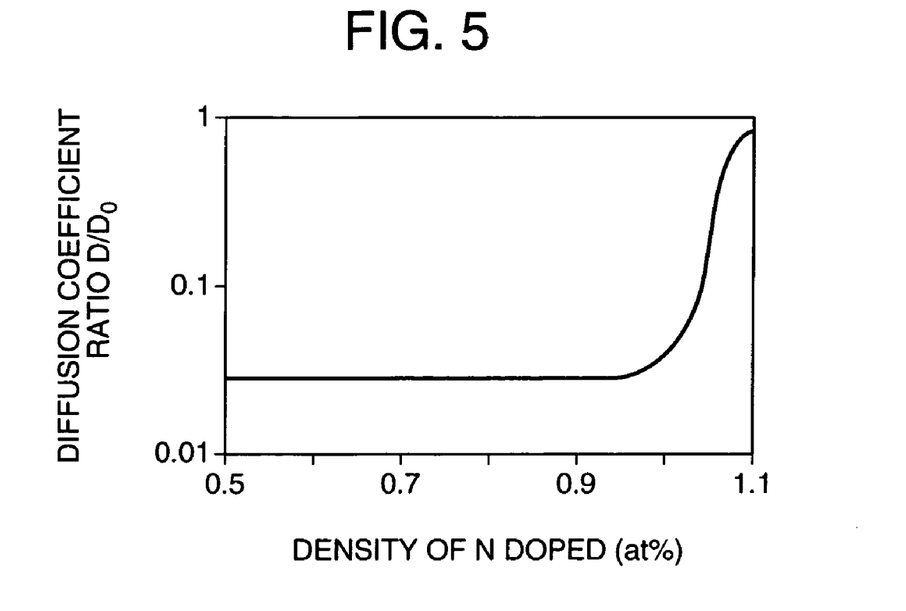
FIG. 5 is a diagram showing the dopant concentration dependency of D/Do in a high concentration region in the case of N doped into the silicon germanium.

FIG. 4 shows a simulation result of the dopant concentration dependency of D/Do in a low density region in the case of doping nitrogen (N) into the silicon germanium. FIG. 5 shows a result indicative of the dopant concentration dependency of D/Do in a high density region.

More precisely, FIG. 4 is a graph showing the diffusion coefficient of germanium at 900° C. in the event of diffusion of the germanium in the gate electrode formed of a silicon-germanium cubic body with each side of 3 nm, with respect to a region that is low in doping concentration of nitrogen. FIG. 5 is a graph showing the diffusion coefficient of germanium at 900° C. upon diffusion of the germanium in the gate electrode of the silicon-germanium cubic body with each side of 3 nm, concerning a region that is high in doping concentration of the nitrogen.

In the case of Co being added by doping to the silicon germanium, a result shown in FIG. 2 is obtained, which demonstrates that the diffusion coefficient of Ge in silicon germanium behaves to decrease rapidly when the concentration or density of Co to be doped into the silicon germanium goes beyond 0.03 at %. Also note that when adding Co to a concentration of 0.08 at % or greater, the result is that the diffusion coefficient of interest is reduced to less than or equal to about one-tenth ($\frac{1}{10}$) of that in the case of no dopants. As shown in FIG. 3, this effect becomes rapidly weaker when the Co concentration exceeds 1.4 at %. It can also be seen that when adding Co up to 1.7 at %, the diffusion coefficient increases to about half of that in the case of no dopants.

Next, in case nitrogen (N) is added to silicon germanium, the result is shown in FIG. 4. As shown herein, the diffusion coefficient of Ge in the silicon germanium rapidly decreases when the concentration of N being doped into the silicon germanium exceeds 0.012 at %. When adding N to a concentration of 0.03 at % or more, there is obtained an effect which follows: the diffusion coefficient decreases to less than or equal to about one-thirtieth ($\frac{1}{30}$) of that in the case of no dopants. As shown in FIG. 5, this effect becomes weak rapidly when the N concentration is in excess of 0.9 at %. It is also understandable that when adding N to a concentration of 1.06 at %, the diffusion coefficient increases up to about half ($\frac{1}{2}$) of that in the case of no dopants.

Accordingly, in cases where Co is added by doping to the gate electrode made of silicon germanium for use as its main constituent material, the doping level of Co is set at 0.03 at % or greater. Alternatively, it is preferable to cause the doping level to be less than or equal to 1.7 at %. More preferably, Co is doped to a concentration of 0.08 at % or more; alternatively, furthermore, the same is doped at a concentration of 1.4 at % or less. With this setting, it is possible to suppress or minimize the self-diffusion of Ge in the gate electrode.

Also importantly, in the case of doping N, the doping amount is carefully controlled so that its resultant concentration stays at 0.012 at % or less. Alternatively, moreover, it is preferable to set it at 1.06 at % or less. More preferably, N is doped to a concentration of 0.03 at % or greater; alternatively, furthermore, the same is doped to a concentration of 0.9 at % or less. This makes it possible to restrain the diffusion of Ge in the gate electrode.

Figure 6:
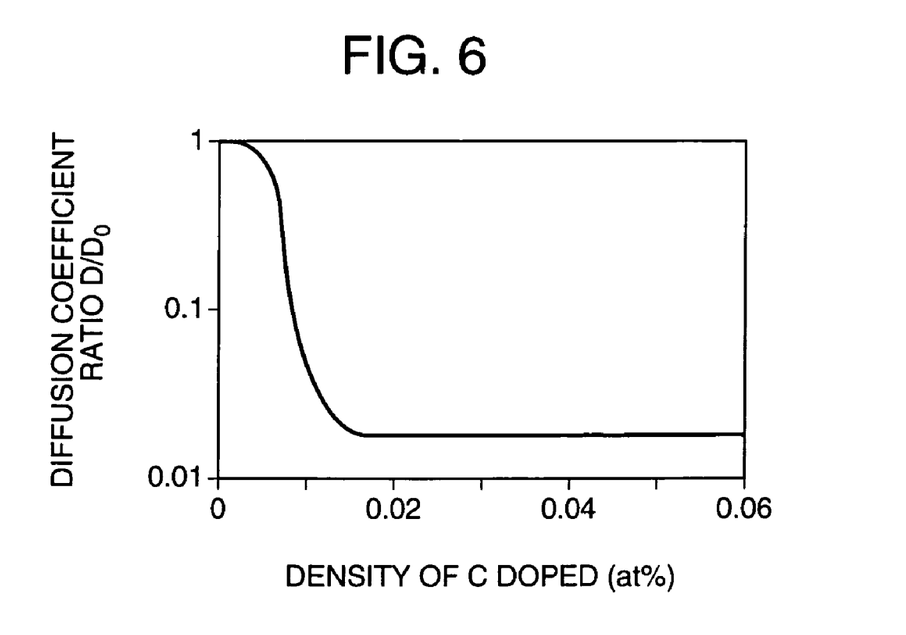
FIG. 6 is a diagram showing the dopant concentration dependency of D/Do in a low concentration region in the case of C doped into the silicon germanium.
Figure 7:
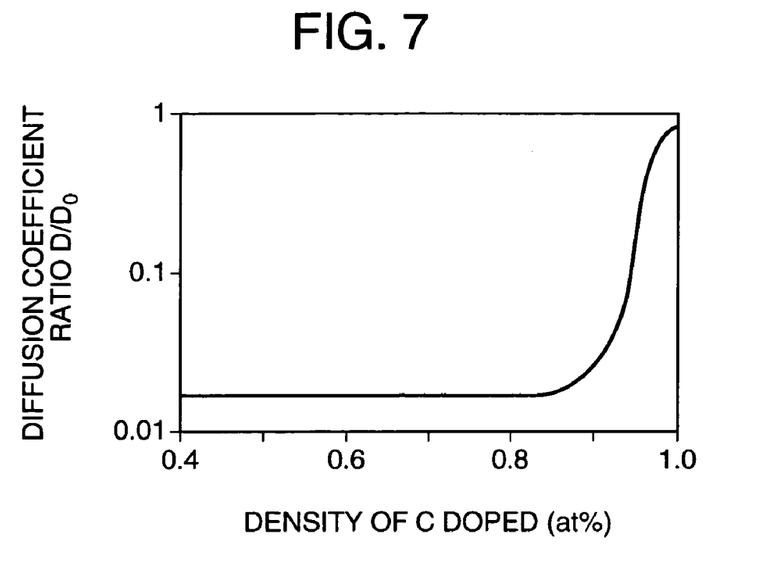
FIG. 7 is a diagram showing the dopant concentration dependency of D/Do in a high concentration region in the case of C doped into the silicon germanium.

Next, the case of adding carbon (C) was studied. FIG. 6 shows a simulation result of the dopant concentration dependency of D/Do in a low density region in the case of doping C into silicon germanium. FIG. 7 shows a result of the D/Do dopant concentration dependency in a high density region. More specifically, FIG. 6 is a graph showing the diffusion coefficient of germanium at 900° C. in the event of diffusion of the germanium in the gate electrode formed of a silicon-germanium cubic body with each side of 3 nm, with respect to a region that is low in doping concentration of carbon. FIG. 7 is a graph showing the diffusion coefficient of germanium at 900° C. when the germanium in the gate electrode of the silicon-germanium cubic body with each side of 3 nm, in relation to a region that is high in doping concentration of the carbon.

In the case where C is added to the silicon germanium, a result is shown in FIG. 6, which demonstrates that the diffusion coefficient of Ge in silicon germanium rapidly decreases when the concentration of C being doped into the silicon germanium exceeds 0.008 at %. Also note that when doping C to a concentration of 0.02 at % or higher, an effect obtained thereby is that the diffusion coefficient is reduced to less than or equal to about one-fiftieth (1/50) of that in the case of adding no dopants. As shown in FIG. 7, this effect becomes weak rapidly when the concentration of C exceeds 0.8 at %. It is also seen that when doping C to a concentration of 0.96 at %, the diffusion coefficient increases to about half of that in the case of no dopants.

Consequently, in the case of doping C, let its concentration be 0.008 at % or more. Alternatively, it is preferable to further set it at 0.96 at % or less. More preferably, C is doped to a concentration ranging from 0.02 to 0.8 at %—i.e., greater than or equal to 0.02 at % and yet less than or equal to 0.8 at %. This makes it possible to suppress or avoid the diffusion of Ge in the gate electrode.

The effects stated above are also obtainable in other forms as far as the dopants are added in such a way as to stay within the above-noted concentration ranges; for example, similar results are obtained in differently designed device structures with both Co and N contained in the gate electrode or alternatively with Co and C doped thereinto. Still alternatively, Co and C plus N may be contained together therein.

It should be noted that even in these cases, a similar indication is available even when modifying the analysis model in calculation conditions including but not limited to the size, temperature and Si-to-Ge content ratio. The Si/Ge content ratio of the silicon germanium used in this embodiment is changeable when the need arises.

In addition, as stated previously, it is possible to reduce any possible increase in leakage current while attaining low resistance. It is also possible by the Co doping to reduce the electrical resistivity of a Co-doped film(s). Note here that in view of the fact that the Co doping results in obtainment of an electrical resistance reduction effect, it is preferable to apply the principal concepts of the invention to MOS transistor-equipped semiconductor devices under the quest for achieving high-speed performance and low power consumption. Another advantage is that the use of N atoms facilitates adjustment of the doping concentration thereof. Additionally, using C atoms makes it possible to improve the strength of a C-doped film. Furthermore, it is possible to obtain an effect of significantly suppressing the diffusion of Ge.

In order to reduce the electrical resistivity between the gate electrode 14 and source/drain regions 12 and also contact plug 7, the silicide 18, 19 is designed to employ a silicide film with a chosen metal such as W or Mo as its main constituent material or a metal film, or alternatively a multilayered film of such silicide and metal films. In case Co is added to the gate electrode 14, Co is used for the main component material of the silicide 18, 19 to thereby enable cost reduction. Due to this, it is preferable to comprise a form which has a silicide layer overlying the gate electrode, wherein the silicide is formed of a silicide film with cobalt as its main component material or a metal film or alternatively a multilayered structure of the silicide film and metal film.

Additionally the diffusion speed or rate of the above-noted atoms is such that single-crystals become larger than polycrystals. By forming the silicon germanium for use as the gate electrode by polycrystalline material, it is possible to fabricate an effective semiconductor device.

Note here that the minimum feature size of the gate electrode of a semiconductor device to which the invention is applied is desirably set to range from 0.4 to 0.03 micrometers ($\mu$m), although the invention is not exclusively limited thereto.

Optionally, the silicon substrate 1 may be modified in structure to have a silicon-on-insulator (SOI) structure.

An insulative layer (for example, this may be made of silicon oxide) is disposed on or above the semiconductor substrate (e.g., single-crystalline silicon or the like is employable). Formed on this layer is a semiconductor layer (e.g., single-crystallized silicon is usable). It is possible to take a form with a gate dielectric film formed on the semiconductor layer and also with a gate electrode on this gate dielectric film.

With the semiconductor device having the above-described form, it is possible to provide a semiconductor device with high reliability capable of suppressing changes in characteristics such as transistor threshold voltages.

In addition, having the aforesaid form makes it possible to provide a semiconductor device with highly stabilized operability capable of preventing or at least greatly suppressing the diffusion of germanium from either the gate electrode or the channel underlayer film. Alternatively it is possible to provide a semiconductor device which has its gate electrode unit that is low in electrical resistivity and thus offers the supportability of high-speed performances. Still alternatively it is possible to provide a semiconductor device that is high in reliability while suppressing changes in strain being given to a channel(s). Alternatively it is possible to provide a semiconductor device manufacturable at high yields while reducing production costs.

Second Embodiment

Figure 8:
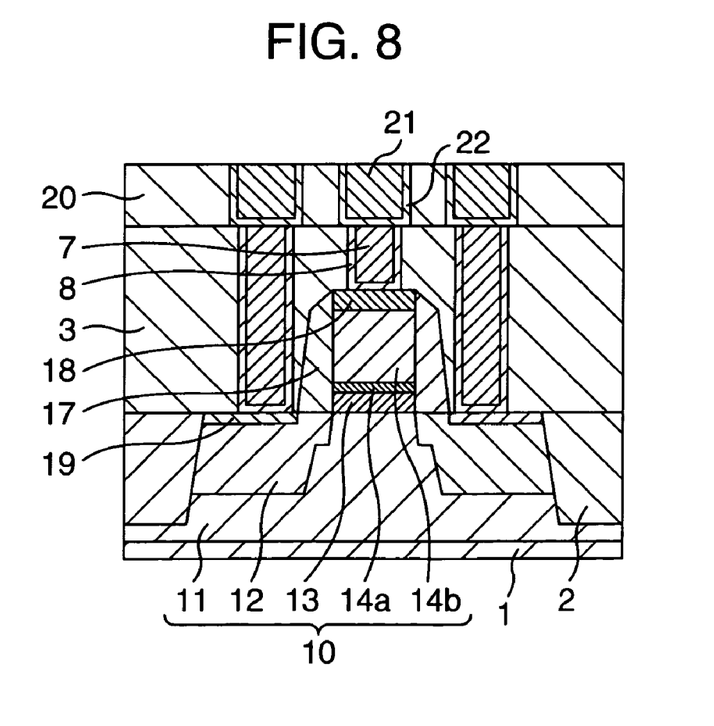
FIG. 8 is a cross-sectional diagram of main part of a semiconductor device which is a second embodiment of this invention.

A cross-sectional structure of main part of a semiconductor device in accordance with a second embodiment of this invention is shown in FIG. 8. A principal difference of the second embodiment from the first embodiment is that the gate electrode has a two-layer structure consisting essentially of a first gate electrode 14$a$ and a second gate electrode 14$b$. Regarding the remaining parts or components, the second embodiment is similar in structure to the first embodiment. Silicon germanium is used for the second gate electrode 14$b$ as its main component material, which electrode 14$b$ is arranged to contain Co or N as doped thereinto to a concentration similar to that of the gate electrode 14 of the first embodiment stated supra. Alternatively the gate electrode 14$b$ is designed to contain C at a concentration similar to that of the gate electrode 14 of first embodiment. The first gate electrode 14$a$ is made of either silicon or silicon germanium as its main constituent material. Note that the doping atoms or "dopants" as recited in the first embodiment are not contained therein. Alternatively, in some cases, such atoms may be doped to a concentration less than that of the above-noted dopant added to the second gate electrode 14b. Whereby, it is possible to effectively prevent the dopants from coming into contact with the gate dielectric film. This in turn makes it possible to suppress the lowering of electrical property otherwise occurring due to the flow of a leakage current resulted from the presence of such dopants.

Third Embodiment

Figure 9A:
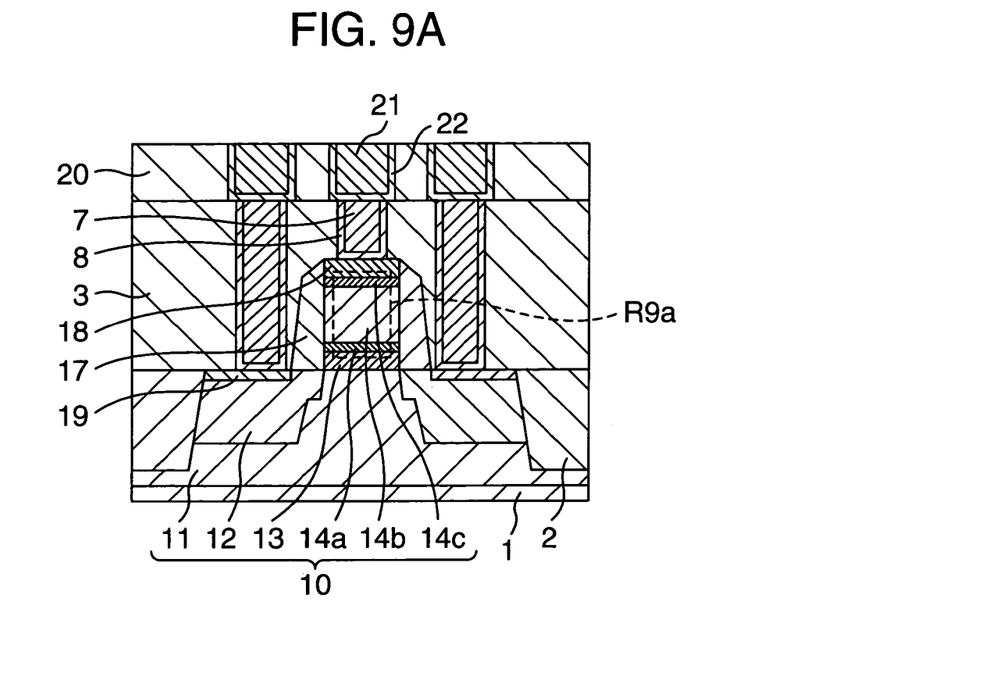
FIG. 9A is a sectional diagram of main part of a semiconductor device which is a third embodiment of the invention; and, FIG. 9B is a sectional diagram showing the structure of one region in FIG. 9A along with a diagram showing a concentration distribution of added elements as contained in such region.
Figure 9B:
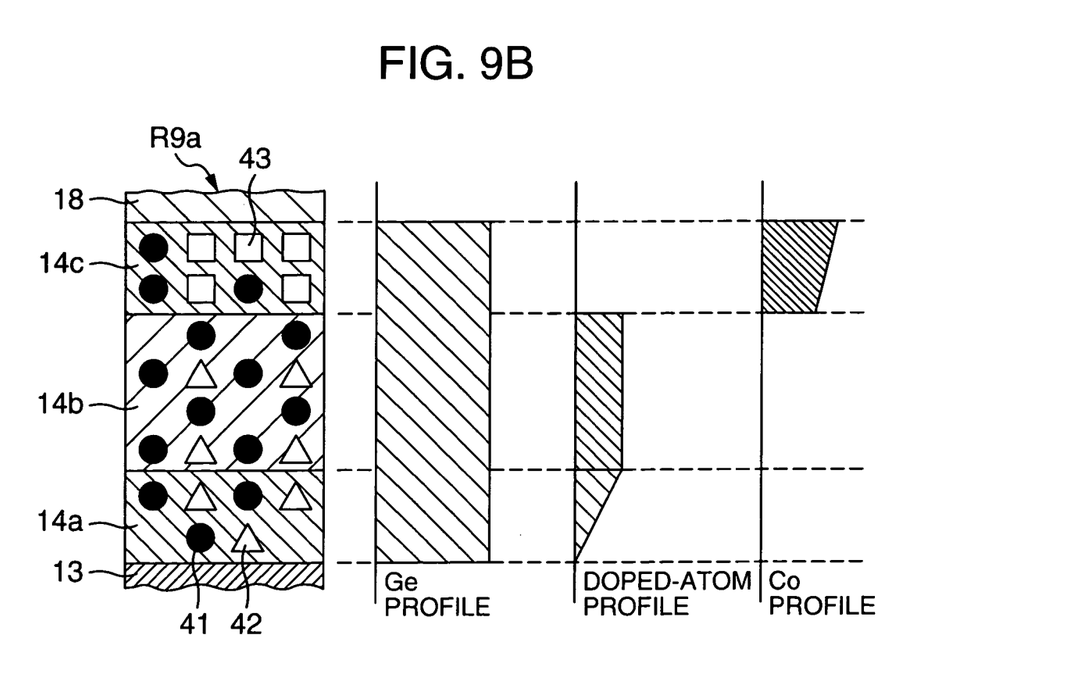

A sectional structure of main part of a semiconductor device which is a third embodiment of the invention is shown in FIG. 9A. A main difference of the third embodiment over the first embodiment lies in that the gate electrode has a three-layer structure consisting essentially of a first gate electrode 14a, a second gate electrode 14b and a third gate electrode 14c. The third embodiment is similar to the first embodiment in structures of the other parts. Silicon germanium is used as the main component material of the first gate electrode 14a, second gate electrode 14b and third gate electrode 14c. The second gate electrode 14b is arranged to contain either Co or N, which is doped to a concentration similar to that of the gate electrode 14 of the first embodiment. Alternatively let it contain C as its doping atoms at a concentration similar to that of the gate electrode 14 of first embodiment. As shown in FIG. 9B, the first gate electrode 14a contains Co or N as its doped atoms at a concentration similar to that of the gate electrode 14 of first embodiment, at or near an interface relative to the second gate electrode 14b. The first gate electrode 14a is designed to contain the doped atoms in such a way as to have a density distribution or "profile," which simply decreases toward the gate dielectric film 13 while letting it become almost zero at the interface with the gate dielectric film 13. Alternatively, the gate electrode is arranged to include C as its doped atoms at a concentration similar to that of the gate electrode 14 of first embodiment, wherein this electrode contains the doped atoms to thereby have a density distribution which simply decreases toward the gate dielectric film 13 while becoming almost zero at the interface with the gate dielectric film 13. Whereby, it is possible to prevent an interface defect potential from occurring due to contact of the doped atoms contained in the gate electrode with the gate dielectric film, thereby enabling suppression of any appreciable leakage currents. The third gate electrode 14c is arranged as shown in FIG. 9B so that it contains Co as its doped atoms at a concentration similar to that of gate electrode 14 of first embodiment, at a nearby portion of the interface with the second gate electrode 14b. Let it contain Co in such a manner that the concentration simply increases toward the silicide 18 to thereby have a concentration profile with the concentration becoming almost 50% at the interface with silicide 18. Thus it is possible to reduce a difference in electrical resistivity or resistance between the gate electrode and the silicide. Optionally, Co is usable as the doped atoms to be contained in the first gate electrode 14a and second gate electrode 14b. This makes it possible to reduce manufacturing costs.

It is noted that the gate electrode of the third embodiment is modifiable to have a two-layer structure which includes the first gate electrode 14a and second gate electrode 14b or alternatively the second gate electrode 14b and third gate electrode 14c.

Fourth Embodiment

Figure 10:
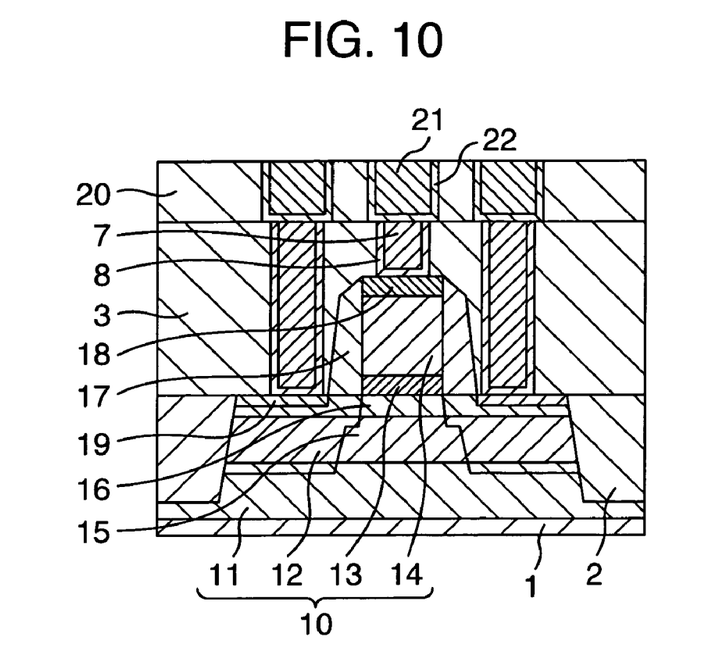
FIG. 10 is a sectional diagram of main part of a semiconductor device which is a fourth embodiment of the invention.

A sectional structure of main part of a semiconductor device which is a fourth embodiment of the invention is shown in FIG. 10. The semiconductor device of the fourth embodiment comprises under its gate electrode 13 a channel region 16 which is made of silicon as its main component material and also includes beneath the channel 16 a channel underlayer film 15 made of silicon germanium as its main component material. The channel underlayer film 15 is arranged to contain either Co or N as additive atoms at a concentration similar to that of the gate electrode 14 of first embodiment. Alternatively the film 15 is designed to contain C as its doped atoms at a concentration similar to that of the gate electrode 14 of first embodiment. With such an arrangement, it is possible to suppress the diffusion of Ge in the channel underlayer film 15, thereby enabling prevention of changes of strain being given to the channel 16.

Note here that the structure on the channel 16 is replaceable with the structure in any one of the first to third embodiments stated supra or alternatively with other possible structures. Also note that the content ratio of Si and Ge in the silicon germanium may be changed in value as circumstances demand to do so.

Fifth Embodiment

Figure 11:
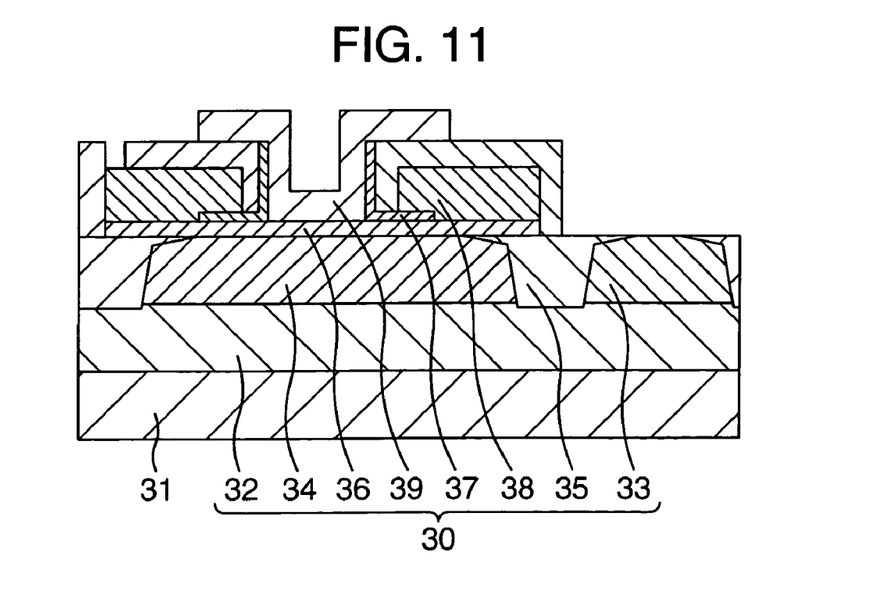
FIG. 11 is a sectional diagram of main part of a semiconductor device which is a fifth embodiment of the invention.

A sectional structure of main part of a semiconductor device which is a fifth embodiment of the invention is shown in FIG. 11. As shown herein, the semiconductor device of this embodiment is made up of a bipolar transistor 30, which is formed on an n-type semiconductor substrate 31.

The bipolar transistor 30 includes a heavily-doped n (n$^+$) type substrate 32, 33, an n-type epitaxial layer 34, a silicon oxide film 35, a p-type epitaxial base layer 36, a spacer 37 with a lamination of silicon nitride and silicon oxide films, a p$^+$-type polycrystalline silicon 38, and an n$^+$-type polysilicon 39. The p-type epitaxial base layer 36 uses silicon germanium as its main component material and contains Co or N as its doped atoms at a concentration similar to that of the gate electrode 14 of the first embodiment. Alternatively this layer is arranged to contain C at a concentration similar to that of the gate electrode 14 of first embodiment.

In this embodiment, it is possible to provide a stability-enhanced semiconductor device capable of avoiding diffusion of germanium from the base layer. Thus it is possible to provide a semiconductor device with high reliability and with a property to restrain or minimize changes in characteristics such as threshold voltages or the like.

It should be noted that although the semiconductor device of this embodiment is an NPN bipolar transistor, this is replaceable by a PNP bipolar transistor with the n-type substrate 31, n$^+$-type substrate 32, 33, n-type epitaxial layer 34 and n$^+$-type polysilicon 39 being of the p conductivity type while letting the p-type epitaxial base layer 36 and p$^+$-type polysilicon 38 have n type.

It is also permissible that the n-type substrate 31 is modified to have an SOI structure.

In accordance with this invention, it is possible to provide a high-performance and low-resistance semiconductor device capable of reducing leakage currents.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor device comprising:
   a semiconductor substrate;
   a gate dielectric film formed above said semiconductor substrate; and
   a gate electrode formed above said gate dielectric film, wherein said gate electrode contains germanium and carbon, and wherein said carbon is less in amount than said germanium and is contained to a level of greater than or equal to 0.008 at % and yet less than or equal to 0.96 at %.

2. A semiconductor device comprising:
a semiconductor substrate;
a gate dielectric film formed above said semiconductor substrate; and
a gate electrode formed above said gate dielectric film, wherein
a channel underlayer film is formed on a substrate side of said gate dielectric film via an interval from said gate dielectric film, and wherein
said channel underlayer film is made of silicon germanium chosen as its main constituent material and contains carbon at a concentration of more than or equal to 0.008 at % and yet less than or equal to 0.96 at %.

3. A semiconductor device comprising:
a semiconductor substrate;
a gate dielectric film formed above the semiconductor substrate; and
a gate electrode formed above the gate dielectric film, wherein
the gate electrode contains germanium and also contains cobalt in an amount less than the germanium, and the gate electrode contains cobalt at a concentration of at least about 0.03 atomic percent (at %), but not more than about 1.7 at %.

4. The semiconductor device according to claim 3, further comprising:
a silicide film overlying said gate electrode, said silicide film including cobalt as its main constituent material.

5. A semiconductor device comprising:
a semiconductor substrate;
a gate dielectric film formed above the semiconductor substrate; and
a gate electrode formed above the gate dielectric film, wherein
the gate electrode contains germanium and also contains nitrogen in an amount less than the germanium, and the gate electrode contains nitrogen at a concentration at least about 0.012 at %, but not more than about 1.06 at %.

6. A semiconductor device comprising:
a semiconductor substrate;
a gate dielectric film formed above the semiconductor substrate; and
a gate electrode formed above the gate dielectric film, wherein
a channel underlayer film is formed on a substrate side of the gate dielectric film through an interval from the gate dielectric film, and the channel underlayer film comprises silicon germanium as a main constituent material and contains cobalt at a concentration of at least about 0.03 at %, but not more than about 1.7 at %.

7. A semiconductor device comprising:
a semiconductor substrate;
a gate dielectric film formed above the semiconductor substrate; and
a gate electrode formed above the gate dielectric film, wherein
a channel underlayer film is formed on a substrate side of the gate dielectric film through an interval from the gate dielectric film, and wherein the channel underlayer film comprises silicon germanium as its main constituent material and contains nitrogen at a concentration of at least about 0.012 at %, but not more than about 1.06 at %.

* * * * *